(12) United States Patent
Lin et al.

(10) Patent No.: US 12,278,282 B2
(45) Date of Patent: Apr. 15, 2025

(54) HIGH-ELECTRON MOBILITY TRANSISTOR AND METHOD FOR FABRICATING THE SAME

(71) Applicant: UNITED MICROELECTRONICS CORP., Hsin-Chu (TW)

(72) Inventors: Jian-Li Lin, Kaohsiung (TW); Cheng-Guo Chen, Changhua County (TW); Ta-Kang Lo, Taoyuan (TW); Cheng-Han Wu, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 400 days.

(21) Appl. No.: 17/742,383

(22) Filed: May 11, 2022

(65) Prior Publication Data

US 2023/0335630 A1    Oct. 19, 2023

(30) Foreign Application Priority Data

Apr. 19, 2022  (CN) .......................... 202210409576.8

(51) Int. Cl.
*H01L 29/778* (2006.01)
*H01L 29/40* (2006.01)
*H01L 29/66* (2006.01)

(52) U.S. Cl.
CPC ........ *H01L 29/7786* (2013.01); *H01L 29/404* (2013.01); *H01L 29/66462* (2013.01)

(58) Field of Classification Search
CPC ............. H01L 29/404; H01L 29/66462; H01L 29/41766; H01L 29/402; H01L 29/1066; H01L 29/2003; H01L 29/778
USPC ......................................................... 257/194
See application file for complete search history.

(56) References Cited

U.S. PATENT DOCUMENTS

| | | |
|---|---|---|
| 10,263,103 B2 | 4/2019 | Makiyama |
| 10,930,745 B1 | 2/2021 | Lin |
| 2005/0253168 A1* | 11/2005 | Wu ........................ H01L 29/812 257/E29.253 |
| 2006/0118809 A1* | 6/2006 | Parikh .................. H01L 29/7787 257/E29.127 |
| 2015/0194483 A1 | 7/2015 | Kajitani |

* cited by examiner

*Primary Examiner* — Jasmine J Clark
(74) *Attorney, Agent, or Firm* — Winston Hsu

(57) ABSTRACT

A high-electron mobility transistor includes a substrate, a gate electrode, a drain electrode, a source electrode and a first field plate. The substrate includes an active region. The gate electrode is disposed on the substrate. The drain electrode is disposed at one side of the gate electrode. The source electrode is disposed at another side of the gate electrode. The first field plate is electrically connected with the source electrode and extends from the source electrode toward the drain electrode. An overlapping area of the first field plate and the gate electrode is smaller than an overlapping area of the gate electrode and the active region.

20 Claims, 6 Drawing Sheets

HIGH-ELECTRON MOBILITY TRANSISTOR AND METHOD FOR FABRICATING THE SAME

BACKGROUND OF THE INVENTION

1. Field of the Invention

The present disclosure relates to the field of semiconductor devices, and more particularly, to a high-electron mobility transistor (HEMT) and method for fabricating the same.

2. Description of the Prior Art

HEMTs are transistors using two-dimensional electron gas (2DEG) as carrier channels. Compared with transistors using doped regions as carrier channels, the HEMTs have high electron mobility and high frequency transmission capability, and thus can be applied to high power devices.

However, when the HEMTs are applied to high-power devices, the HEMT may collapse prematurely due to high drain biases. Alternatively, defects may be formed on the surface of the gate electrode during the switching process and the dynamic on-resistance may be affected. Therefore, there is still a need to improve structures of the conventional HEMTs, so as to improve the shortcomings and deficiencies in the prior art.

SUMMARY OF THE INVENTION

According to one aspect of the present disclosure, a high-electron mobility transistor includes a substrate, a gate electrode, a drain electrode, a source electrode and a first field plate. The substrate includes an active region. The gate electrode is disposed on the substrate. The drain electrode is disposed at one side of the gate electrode. The source electrode is disposed at another side of the gate electrode. The first field plate is electrically connected with the source electrode and extends from the source electrode toward the drain electrode. An overlapping area of the first field plate and the gate electrode is smaller than an overlapping area of the gate electrode and the active region.

According to another aspect of the present disclosure, a method for fabricating a high-electron mobility transistor includes steps as follows. A substrate is provided. A gate electrode is formed on the substrate. A drain electrode is formed at one side of the gate electrode. A source electrode is formed at another side of the gate electrode. A first field plate is formed. The substrate includes an active region. The first field plate is electrically connected with the source electrode and extends from the source electrode toward the drain electrode. An overlapping area of the first field plate and the gate electrode is smaller than an overlapping area of the gate electrode and the active region.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the embodiments, reference is made to the accompanying drawings which form a part thereof, and in which is shown by way of illustration specific embodiments in which the disclosure may be practiced. In this regard, directional terminology, such as up, down, left, right, front, back, bottom, top, etc., is used with reference to the orientation of the Figure(s) being described. The components of the present disclosure can be positioned in a number of different orientations. As such, the directional terminology is used for purposes of illustration and is in no way limiting. In addition, identical numeral references or similar numeral references are used for identical components or similar components in the following embodiments.

Hereinafter, for the description of "the first feature is formed on or above the second feature", it may refer that "the first feature is in contact with the second feature directly", or it may refer that "there is another feature between the first feature and the second feature", such that the first feature is not in contact with the second feature directly.

It is understood that, although the terms first, second, etc. may be used herein to describe various components, regions, layers and/or sections, these components, regions, layers and/or sections should not be limited by these terms. These terms may be only used to distinguish one component, region, layer and/or section from another component, region, layer and/or section. Terms such as "first", "second", and other numerical terms when used herein do not imply a sequence or order unless clearly indicated by the context.

Figure 1:
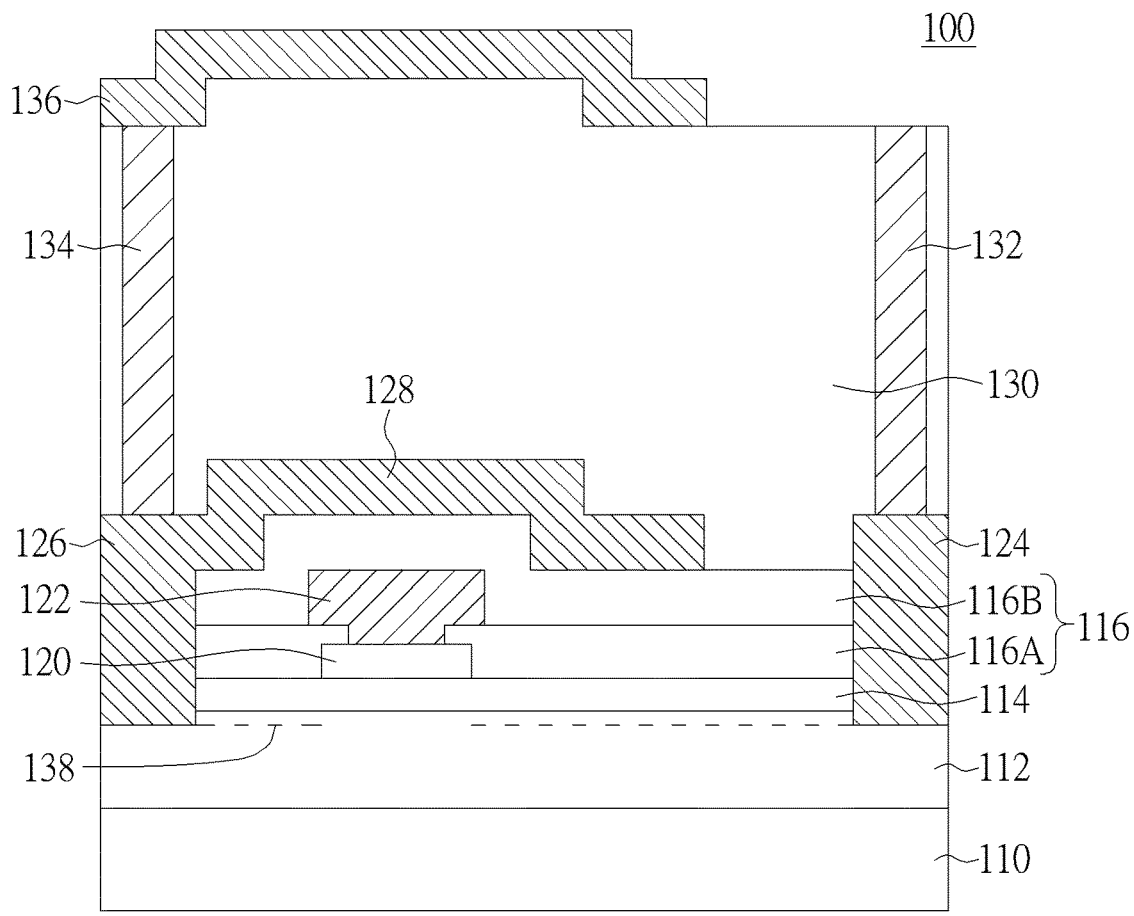
FIG. 1 is a schematic cross-sectional view of a HEMT according to one embodiment of the present disclosure.

Please refer to FIG. 1, which is a schematic cross-sectional view of a HEMT 100 according to one embodiment of the present disclosure. The HEMT 100 at least includes a substrate 110, a gate electrode 122, a drain electrode 124, a source electrode 126 and a first field plate 128. The gate electrode 122 is disposed on the substrate 110, the drain electrode 124 is disposed at one side of the gate electrode 122, and the source electrode 126 is disposed at another side of the gate electrode 122. The first field plate 128 is electrically connected with the source electrode 126 and extends from the source electrode 126 toward the drain electrode 124. With the first field plate 128, it is beneficial to reduce the influence of the high drain biases on the HEMT 100, and can prevent the HEMT 100 from collapsing prematurely, defects formed on the surface of the gate electrode 122 and the influence of the dynamic on-resistance.

The HEMT 100 may further include a channel layer 112, a barrier layer 114 and a passivation layer 116. The channel layer 112 is disposed on the substrate 110. The source electrode 126 may constitute ohmic contact with the channel layer 112. The drain electrode 124 may constitute ohmic contact with the channel layer 112. The barrier layer 114 is disposed on the channel layer 112. The passivation layer 116 is disposed between the gate electrode 122 and the first field plate 128. Two-dimensional electron gas 138 may be generated close to the junction between the channel layer 112 and the barrier layer 114.

The HEMT 100 may further include a gate capping layer 120. The gate capping layer 120 is disposed on the barrier layer 114, and the gate electrode 122 is disposed on the gate capping layer 120. With the gate capping layer 120, the two-dimensional electron gas 138 may not to be generated in the portion of the channel layer 112 directly below the gate capping layer 120, such that a portion of the two-dimensional electron gas 138 is cut off. In this embodiment, the passivation layer 116 is exemplarily illustrated as a double-layer structure. The passivation layer 116 includes a first passivation layer 116A and a second passivation layer 116B. The first passivation layer 116A is disposed on the barrier layer 114 and surrounds the gate capping layer 120. The second passivation layer 116B is disposed on the first passivation layer 116A and covers the gate electrode 122. The second passivation layer 116B is disposed between the gate electrode 122 and the first field plate 128. The first passivation layer 116A and the second passivation layer 116B may be formed sequentially by different steps, and may include the same or different compositions. However, the present disclosure is not limited thereto. For example, in other embodiment, the passivation layer 116 may be a single-layer structure.

The HEMT 100 may further include a dielectric layer 130, two contact plugs 132 and 134 and the second field plate 136. The dielectric layer 130 is disposed on the first field plate 128. The two contact plugs 132 and 134 are disposed in the dielectric layer 130 and are electrically connected with the drain electrode 124 and the source electrode 126, respectively. The second field plate 136 is electrically connected with the source electrode 126 and extends from the source electrode 126 toward the drain electrode 124. With the second field plate 136, the influence of the high drain bias on the HEMT 100 may be further reduced.

The substrate 110 may be, but is not limited to, a bulk silicon substrate, a silicon carbide (SiC) substrate, a sapphire substrate, a silicon on insulator (SOI) substrate, or a germanium on insulator (GOI) substrate.

The channel layer 112 may include one or more of group III-V semiconductor layers. The composition of the group III-V semiconductor layer may be, but is not limited to, GaN, AlGaN, InGaN or InAlGaN. In addition, the channel layer 112 may include one or more of doped group III-V semiconductor layers, such as a P-type group III-V semiconductor layer. As for the P-type group III-V semiconductor layer, the dopants of which may be, but is not limited to, C, Fe, Mg or Zn. In the embodiment, the channel layer 112 is a GaN layer.

The barrier layer 114 may include one or more of group III-V semiconductor layers. The composition of the barrier layer 114 is different from that of the channel layer 112. For example, the barrier layer 114 may include AlN, AlyGa(1−y)N, or a combination thereof, wherein 0<y<1. Since there is a discontinuous band gap between the channel layer 112 and the barrier layer 114, by stacking the channel layer 112 and the barrier layer 114, electrons may be accumulated near the heterojunction between the channel layer 112 and the barrier layer 114 due to the piezoelectric effect. A thin layer of high electron mobility, i.e., the two-dimensional electron gas 138 is generated therebetween. In the embodiment, the barrier layer 114 is an AlGaN layer.

The gate capping layer 120 may include one or more of doped group III-V semiconductor layers. The composition of the gate capping layer 120 may be different from that of the barrier layer 114. For example, the composition of the gate capping layer 120 may be P-type group III-V semiconductor layer. As for the P-type group III-V semiconductor layer, the dopant of which may be, but is not limited to, C, Fe, Mg or Zn. In the embodiment, the gate capping layer 120 is a P-type GaN layer Each of the gate electrodes 122, the drain electrode 124, the source electrode 126, the first field plate 128, the second field plate 136 and the contact plugs 132 and 134 may be a single-layer structure or a multi-layer structure, and the composition thereof may include low-resistance semiconductors such as polysilicon, metals, or alloys. The metals may include, but are not limited to, Al, Cu, W, Au, Pt or Ti.

The composition of the first passivation layer 116A and the second passivation layer 116B may include, but is not limited to $SiO_2$. The composition of the dielectric layer 130 may include, but is not limited to tetraethoxysilane (TEOS).

Figure 2:
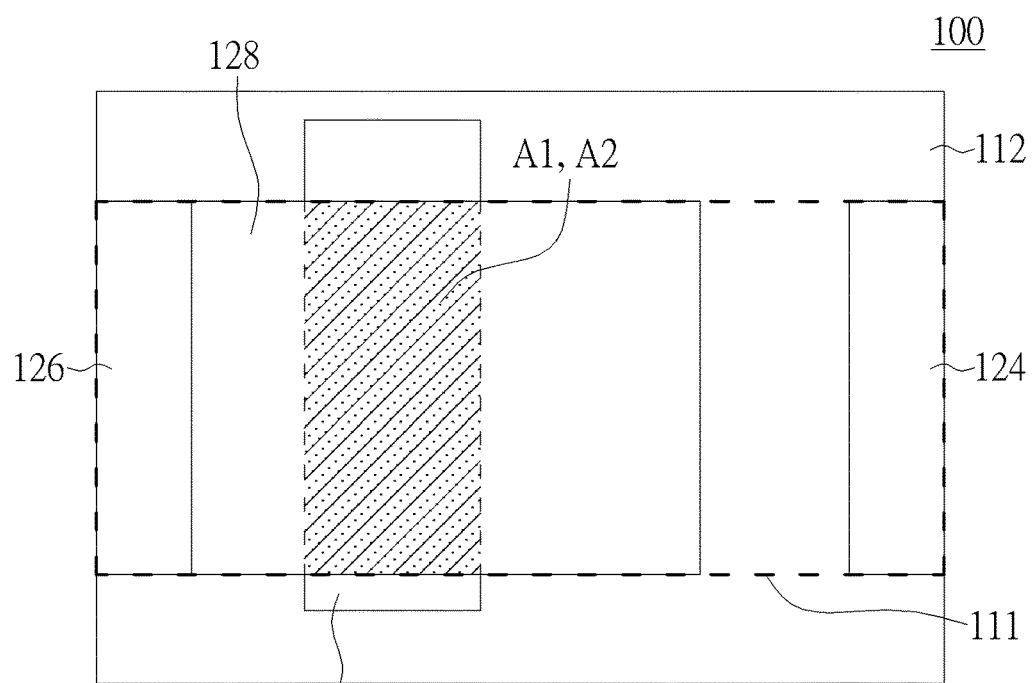
FIG. 2 is a schematic top view of the HEMT of FIG. 1.

Please refer to FIG. 2, which is a schematic top view of the HEMT 100 of FIG. 1. In order to clearly show the relationship between the first field plate 128, the gate electrode 122, the drain electrode 124 and the source electrode 126, the dielectric layer 130, the contact plugs 132 and 134 and the second field plate 136 are omitted in FIG. 2, the overlapping area A1 of the first field plate 128 and the gate electrode 122 is represented by sprinkled dots, and the overlapping area A2 of the gate electrode 122 and the active region 111 is represented by oblique lines. As shown in FIG. 2, the substrate 110 includes an active region 111, the overlapping area A1 of the first field plate 128 and the gate electrode 122 is the same as the overlapping area A2 of the gate electrode 122 and the active region 111.

Figure 3:
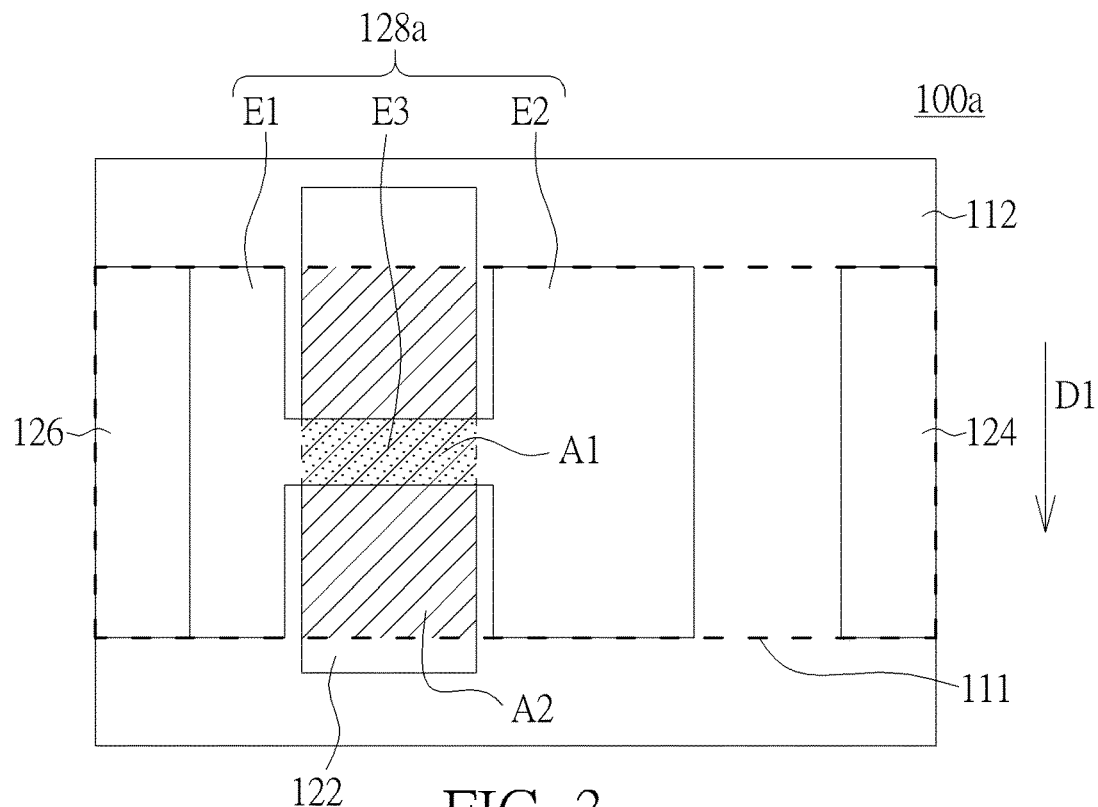
FIG. 3 is a schematic top view of a HEMT according to another embodiment of the present disclosure.

Please refer to FIG. 3, which is a schematic top view of a HEMT 100a according to another embodiment of the present disclosure. The main difference between the HEMT 100a and the HEMT 100 is the shape of the first field plate 128a being different from that of the first field plate 128. Specifically, the gate electrode 122 defines a long side direction D1. The first field plate 128a includes a first extending portion E1, a second extending portion E2 and at least one connecting portion E3. The first extending portion E1 extends parallel to the long side direction D1, the second extending portion E2 extends parallel to the long side direction D1, and the connecting portion E3 is connected between the first extending portion E1 and the second extending portion E2. Herein, the first extending portion E1, the second extending portion E2 and the connecting portion E3 are all located in the active region 111, and the connecting portion E3 extends perpendicular to the long side direction D1, which is exemplary and the present disclosure is not limited thereto. That is, extending directions of the first extending portion E1 and the second extending portion E2 are perpendicular to an extending direction of the connecting portion E3. As such, the first field plate 128a includes an H-shape according to a top view.

An overlapping area A1 of the first field plate 128a and the gate electrode 122 is smaller than an overlapping area A2 of the gate electrode 122 and the active region 111. Compared with the HEMT 100 in FIG. 2, the HEMT 100 in FIG. 2 can reduce the influence of the high drain bias on the HEMT 100 by the first field plate 128. However, the first field plate 128 and the gate electrode 122 overlap with each other, and a parasitic capacitance may be generated between the first field plate 128 and the gate electrode 122. It is known that when the parasitic capacitance is larger, the switching speed of the HEMT 100 is slower, which is unfavorable for the HEMT 100 being applied to a switch. By reducing the overlapping area A1 of the first field plate 128a and the gate electrode 122, the influence of high drain bias on the HEMT 100a can be reduced via the first field plate 128a, and the parasitic capacitance between the first field plate 128a and the gate electrodes 122 can reduced so as to reduce the switching time of the HEMT 100a, which is beneficial for the HEMT 100a being applied to a switch.

Figure 4:
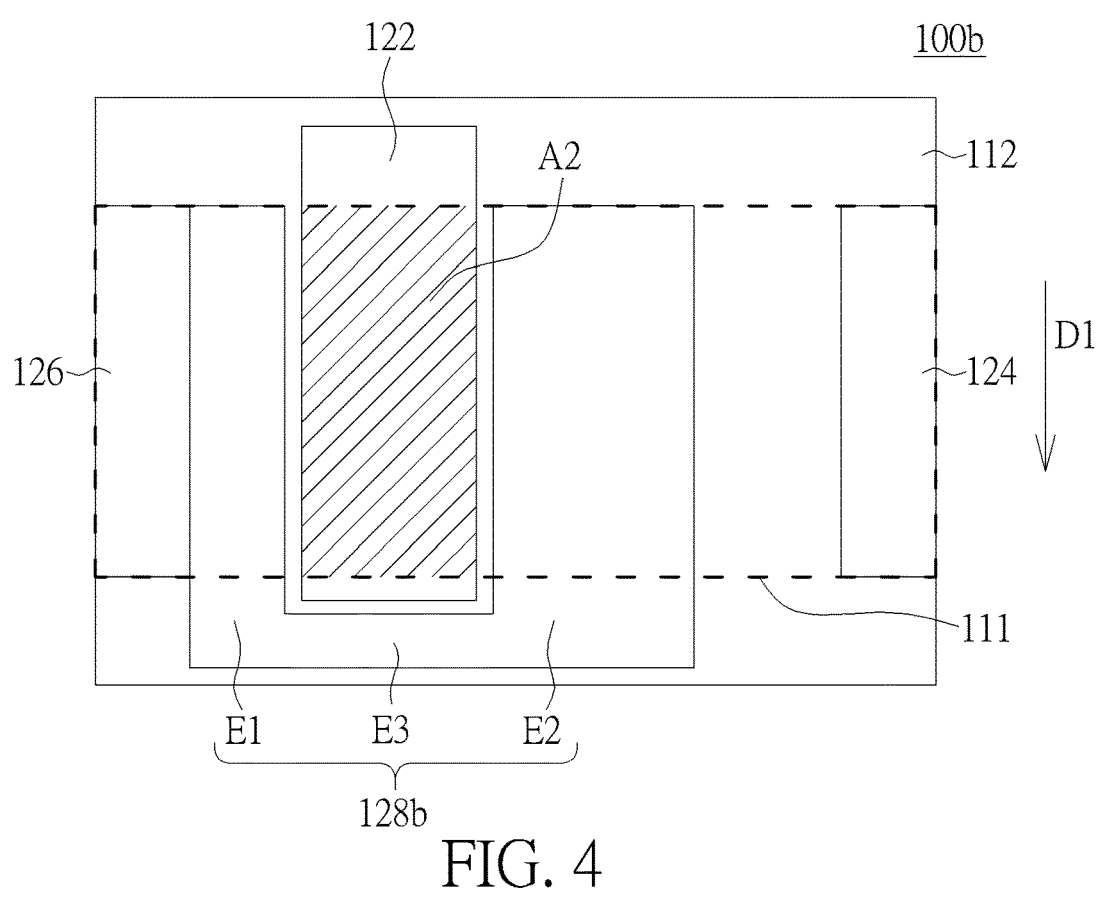
FIG. 4 is a schematic top view of a HEMT according to further another embodiment of the present disclosure.

Please refer to FIG. 4 which is a schematic top view of a HEMT 100b according to further another embodiment of the present disclosure. The main difference between the HEMT 100b and the HEMT 100a is the shape of first field plate 128b being different from that of the first field plate 128a. Specifically, the gate electrode 122 defines a long side direction D1. The first field plate 128b includes a first extending portion E1, a second extending portion E2 and at least one connecting portion E3. The first extending portion E1 extends parallel to the long side direction D1, the second extending portion E2 extends parallel to the long side direction D1, and the connecting portion E3 is connected between the first extending portion E1 and the second extending portion E2. Herein, at least a portion of the first extending portion E1 and at least a portion of the second extending portion E2 are located in the active region 111, the connecting portion E3 is located outside the active region 111 and extends perpendicular to the long side direction D1. That is, extending directions of the first extending portion E1 and the second extending portion E2 are perpendicular to an extending direction of the connecting portion E3, which is exemplary and the present disclosure is not limited thereto. As such, the first field plate 128b includes a U shape according to a top view.

The first field plate 128b is staggered from the gate electrode 122 and does not overlap with the gate electrode 122. The gate electrode 122 and the active region 111 have an overlapping area A2. In other words, in the embodiment, the overlapping area of the first field plate 128b and the gate electrode 122 is smaller than the overlapping area A2 of the gate electrode 122 and the active region 111. Compared with the HEMT 100a in FIG. 3, the HEMT 100b in FIG. 4 has the first field plate 128b being completely staggered from the gate electrode 122. That is, the overlapping area of the first field plate 128b and the gate electrode 122 is 0, which is smaller than the overlapping area A2 of the gate electrode 122 and the active region 111. As such, it is more beneficial to avoid parasitic capacitance generated between the first field plate 128b and the gate electrode 122.

Figure 5:
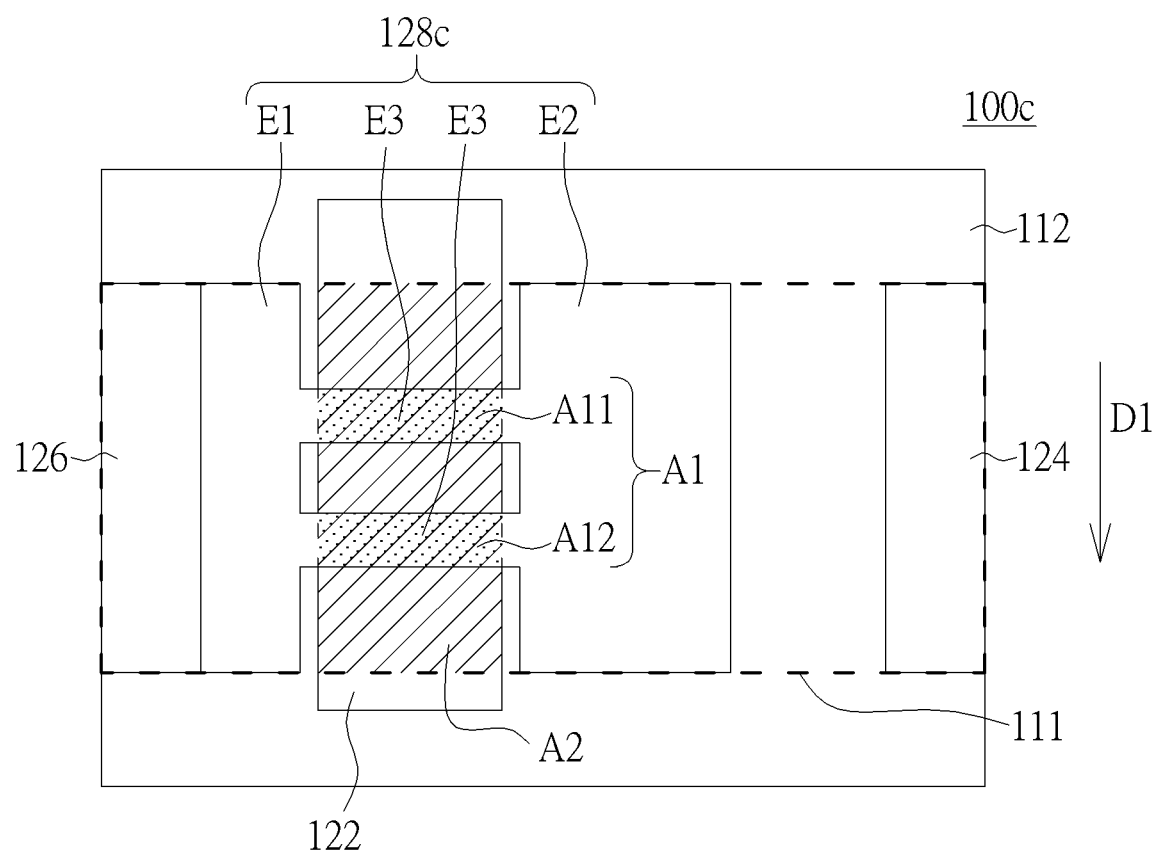
FIG. 5 is a schematic top view of a HEMT according to yet another embodiment of the present disclosure.

Please refer to FIG. 5 which is a schematic top view of a HEMT 100c according to yet another embodiment of the present disclosure. The main difference between the HEMT 100c and the HEMT 100a is the shape of the first field plate 128c being different from that of the first field plate 128a. Specifically, compared with the first field plate 128a, the first field plate 128c includes two connecting portions E3. By increasing the number of the connecting portions E3, the resistance values of the first extending portion E1 to the second extending portion E2 can be reduced. In the embodiment, the overlapping areas of the two connecting portions E3 and the gate electrode 122 are the first overlapping area A11 and the second overlapping area A12, respectively. The overlapping area A1 of the first field plate 128c and the gate electrode 122 is the sum of the first overlapping area A11 and the second overlapping area A12. As shown in FIG. 5, the overlapping area A1 of the first field plate 128c and the gate electrode 122 is smaller than the overlapping area A2 of the gate electrode 122 and the active region 111. According to a top view, the first field plate 128c includes two H-shapes or a rectangular frame shape. For other details of the HEMT 100c, reference may be made to the relevant description of the HEMT 100a, which will not be repeated herein.

In other embodiments, the layout pattern of the first field plate may be adjusted according to practical needs. For example, the number of connecting portions and the extending directions of the connecting portions may be adjusted, so that the first field plate may include an inverted U shape, a rectangular frame shape, an E shape or a K shape according to a top view. In other words, a HEMT has an overlapping area of the first field plate and the gate electrode being greater than or equal to 0, and smaller than an overlapping area of the gate electrode and the active region is within the scope of the present disclosure.

Figure 6:
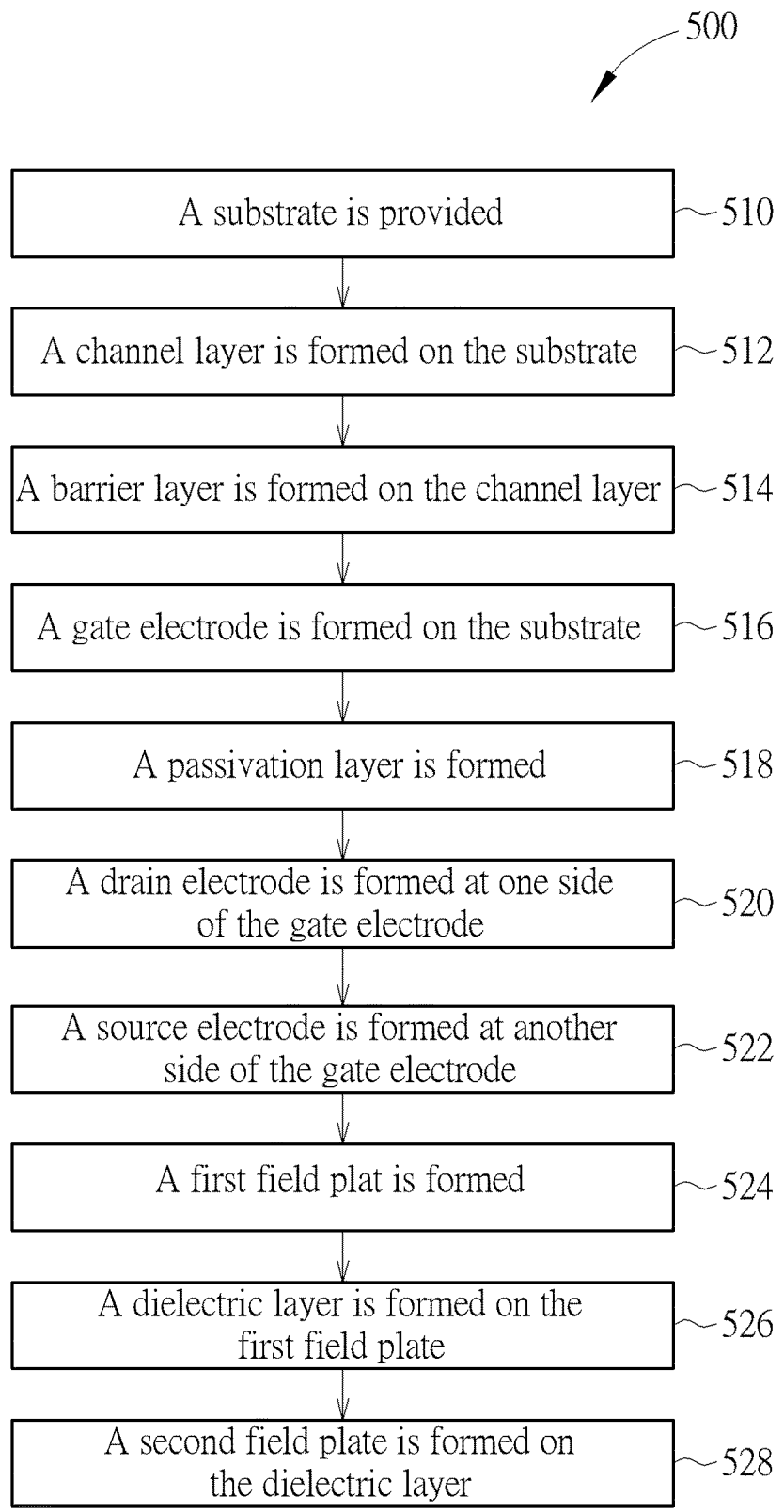
FIG. 6 is a flow diagram showing a method for fabricating a HEMT according to another embodiment of the present disclosure.

Please refer to FIG. 6, which is a flow diagram showing a method 500 for fabricating a HEMT according to another embodiment of the present disclosure. The method 500 includes Steps 510, 516, 520, 522 and 524. In Step 510, a substrate is provided. In Step 516, a gate electrode is formed on the substrate. In Step 520, a drain electrode is formed at one side of the gate electrode. In Step 522, a source electrode is formed at another side of the gate electrode. In Step 524, a first field plate is formed, wherein the substrate includes an active region, the first field plate is electrically connected with the source electrode and extends from the source electrode toward the drain electrode. An overlapping area of the first field plate and the gate electrode is smaller than an overlapping area of the gate electrode and the active region. The method 500 may further include Steps 512, 514, 518, 526 and 528. In Step 512, a channel layer is formed on the substrate. In Step 514, a barrier layer is formed on the channel layer. In Step 518, a passivation layer is formed, wherein the passivation layer is disposed between the gate electrode and the first field plate. In Step 526, a dielectric layer is formed on the first field plate. In Step 528, a second field plate is formed on the dielectric layer.

Figure 7:
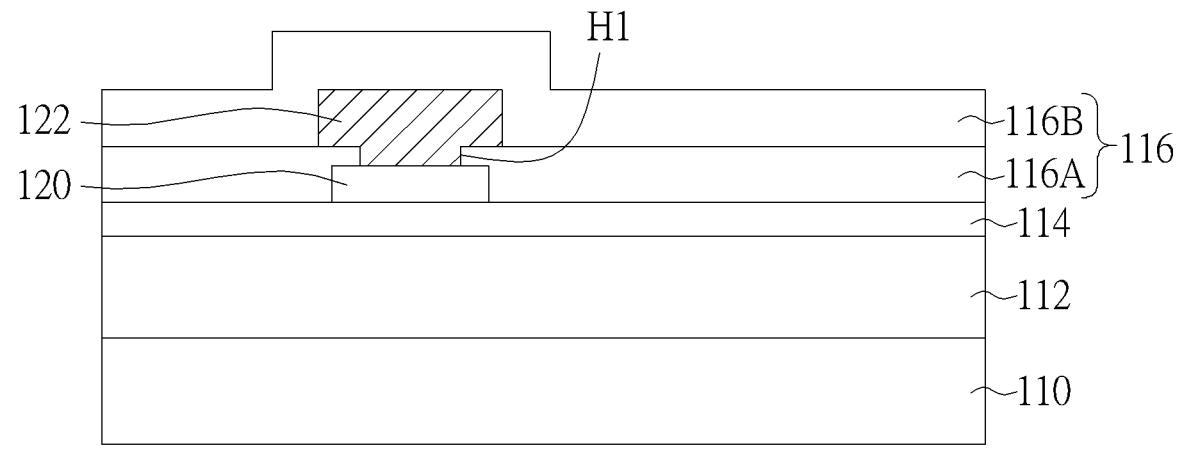
FIG. 7, FIG. 8 and FIG. 9 are schematic diagrams showing steps of the method for fabricating the HEMT in FIG. 6.
Figure 8:
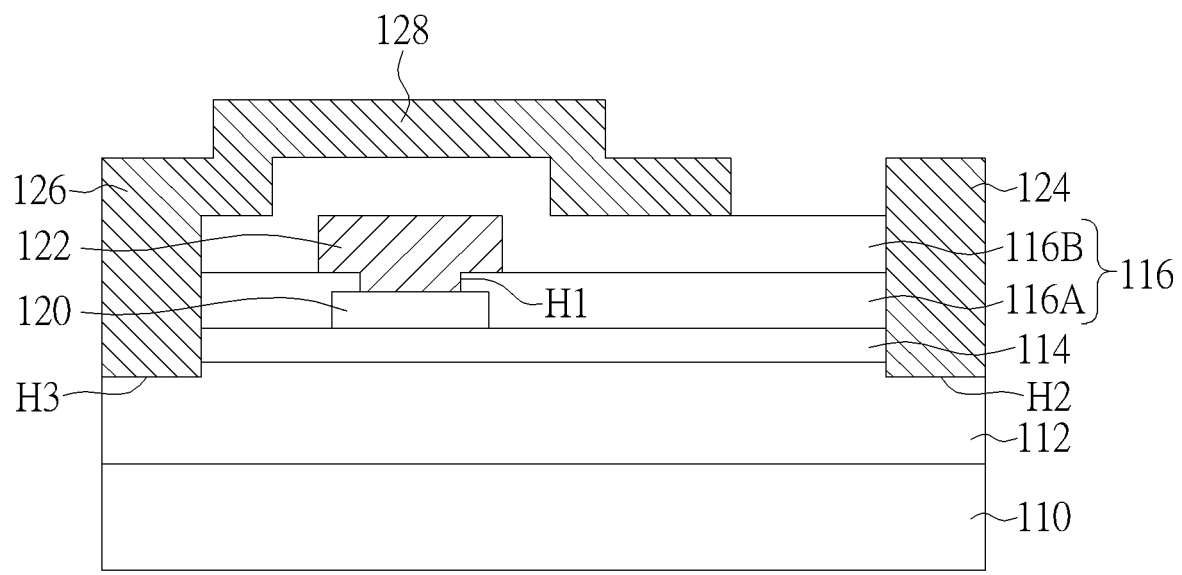
Figure 9:
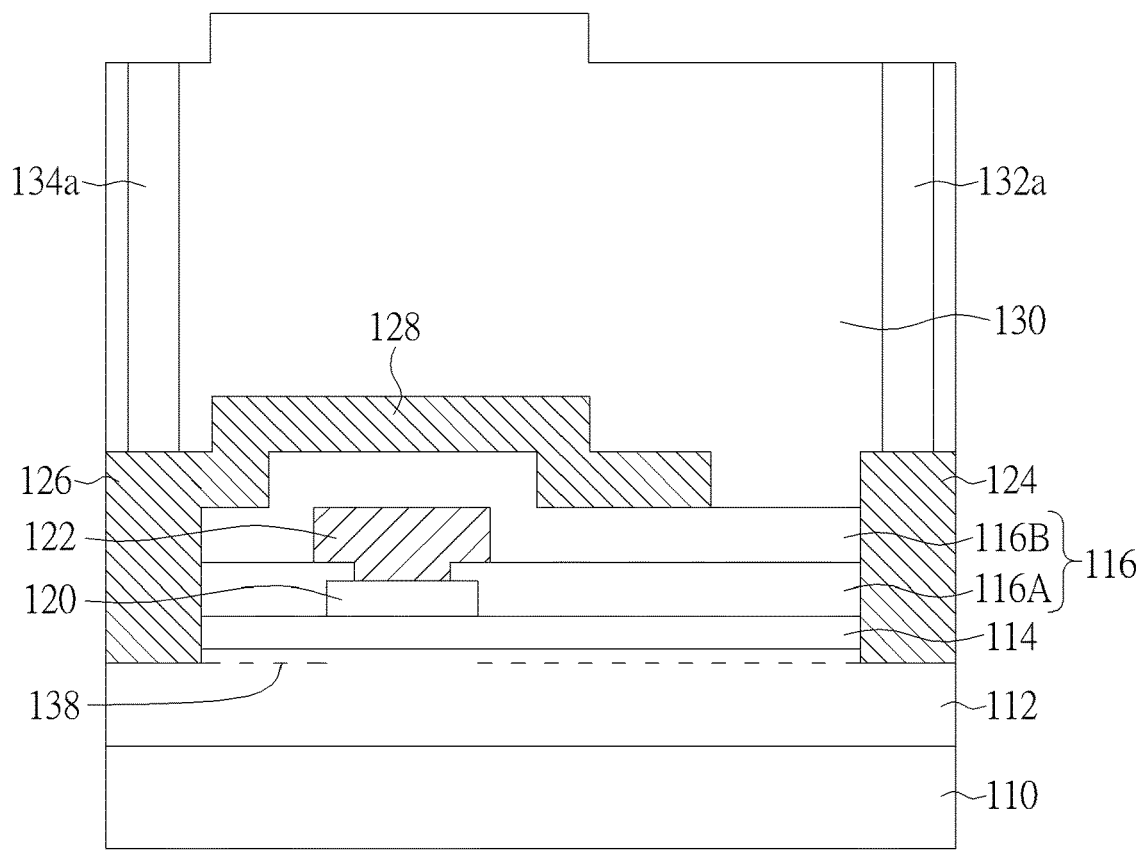

Please refer to FIGS. 7, 8 and 9, which are schematic diagrams showing steps of the method 500 for fabricating the HEMT in FIG. 6. FIGS. 7, 8 and 9 are exemplarily for illustrating how to use the method 500 to fabricating the HEMT 100. In FIG. 7, the substrate 110 is firstly provided (corresponding to Step 510), the channel layer 112 is formed on the substrate 110 (corresponding to Step 512), the barrier layer 114 is formed on the channel layer 112 (corresponding to Step 514), the gate electrode 122 is formed on the barrier layer 114 (corresponding to Step 516). In the embodiment, before forming the gate electrode 122, the following steps may be conducted in sequence. The gate capping layer 120 is formed on the barrier layer 114. The first passivation layer 116A is formed to cover the gate capping layer 120 and the barrier layer 114. The first passivation layer 116A is patterned to form the hole H1, and the material of the gate electrode 122 is filled in the hole H1 and to cover the first passivation layer 116A. The material of the gate electrode 122 is patterned to form the gate electrode 122. The second passivation layer 116B is formed to cover the gate electrode 122 and the first passivation layer 116A (corresponding to Step 518).

Afterward, as shown in FIG. 8, the holes H2 and H3 are formed, and the holes H2 and H3 are filled with a low-resistance semiconductor, a metal or an alloy material. The low-resistance semiconductor, the metal or the alloy material is patterned to form the drain electrode 124, the source electrode 126 and the first field plate 128 (corresponding to Steps 520, 522 and 524).

Afterward, as shown in FIG. 9, the dielectric layer 130 is formed on the first field plate 128 (corresponding to Step 526), wherein the dielectric layer 130 covers the drain electrode 124 and the source electrode 126 at the same time. The holes 132a and 134a are formed. A low-resistance semiconductor, a metal or an alloy material is filled in the holes 132a and 134a and to cover the dielectric layer 130. The low-resistance semiconductor, the metal or the alloy material is patterned to formed the contact plugs 132 and 134 and the second field plate 136 (corresponding to Step 528), such that the HEMT 100 shown in FIGS. 1 and 2 is obtained.

The layers stacked on the substrate 110, such as the channel layer 112, the barrier layer 114 and the gate capping layer 120, may be formed by any suitable methods. The method may be, but is not limited to molecular-beam epitaxy (MBE), metal organic chemical vapor deposition (MOCVD), hydride vapor phase epitaxy (HVPE) or atomic layer deposition (ALD). Furthermore, how to form the holes H1, H2, H3, 132a and 134a, and how to pattern are well known in the art, and will not be repeated here.

The methods for fabricating the HEMT 100a, HEMT 100b, and HEMT 100c in FIGS. 3 to 5 are similar to the method for fabricating the HEMT 100 in FIGS. 1 and 2. The difference therebetween is to change the mask pattern when patterning the low-resistance semiconductor, the metal or the alloy material to form the drain electrode 124, the source electrode 126 and first field plate 128 (corresponding to Steps 520, 522 and 524) shown in FIG. 8, so that the shapes of the first field plates 128a, 128b, 128c are different from that of the first field plate 128. In other words, compared with the HEMT 100 shown in FIGS. 1 and 2, it does not require extra processes to fabricating the HEMT 100a, HEMT 100b and HEMT 100c shown in FIGS. 3 to 5 to allow the parasitic capacitance between the gate electrode 122 and each of the first field plates 128a, 128b and 128c to be smaller than the parasitic capacitance between the gate electrode 122 and first field plate 128.

Figure 10:
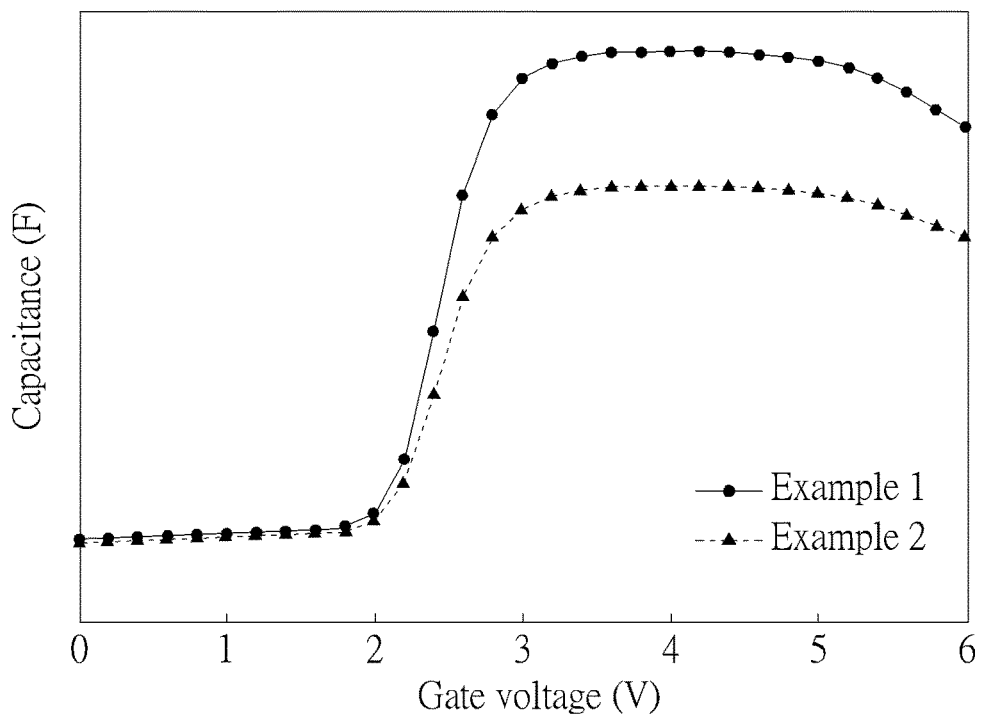
FIG. 10 is a diagram showing relationships between capacitance and gate voltage of Example 1 and Example 2 according to the present disclosure.

Please refer to FIG. 10, which is a diagram showing relationships between capacitance and gate voltage of Example 1 and Example 2 according to the present disclosure, wherein the capacitances includes the capacitance between the gate electrode and the source electrode and the capacitance between the gate electrode and the drain electrode. Example 1 is based on the HEMT 100 shown in FIGS. 1 and 2, and Example 2 is based on the HEMT 100a shown in FIG. 3. As shown in FIG. 10, the parasitic capacitance can be effectively reduced by the overlapping area A1 of the first field plate 128a and the gate electrode 122 being smaller than the overlapping area A2 of the gate electrode 122 and the active region 111, so that the HEMT 100a has improved performance.

Compared with the prior art, the present disclosure can reduce the influence of the high drain biases on the HEMT by the first field plate, so as to prevent the HEMT from collapsing prematurely, defects formed on the surface of the gate electrode and the influence of the dynamic on-resistance. The present disclosure can reduce the parasitic capacitance between the first field plate and the gate electrodes by reducing the overlapping area of the first field plate and the gate electrode, so as to reduce the switching time of the HEMT, which is beneficial for the HEMT being applied to a switch.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high-electron mobility transistor, comprising:
    a substrate comprising an active region;
    a gate electrode disposed on the substrate;
    a drain electrode disposed at one side of the gate electrode;
    a source electrode disposed at another side of the gate electrode; and
    a first field plate electrically connected with the source electrode and extends from the source electrode toward the drain electrode, wherein an overlapping area of the first field plate and the gate electrode is smaller than an overlapping area of the gate electrode and the active region.

2. The high-electron mobility transistor of claim 1, wherein a long side direction is defined by the gate electrode, the long side direction is parallel to a long side of the gate electrode, and the first field plate comprises:
    a first extending portion extending parallel to the long side direction;
    a second extending portion extending parallel to the long side direction; and
    at least one connecting portion connected between the first extending portion and the second extending portion.

3. The high-electron mobility transistor of claim 2, wherein the at least one connecting portion is located in the active region.

4. The high-electron mobility transistor of claim 3, wherein the first field plate comprises an H shape.

5. The high-electron mobility transistor of claim 2, wherein the at least one connecting portion is located outside the active region.

6. The high-electron mobility transistor of claim 5, wherein the first field plate comprises a U shape.

7. The high-electron mobility transistor of claim 1, further comprising:
    a dielectric layer disposed on the first field plate.

8. The high-electron mobility transistor of claim 7, further comprising:
    a second field plate disposed on the dielectric layer, wherein the second field plate is electrically connected with the source electrode and extends from the source electrode toward the drain electrode.

9. The high-electron mobility transistor of claim 1, further comprising:
    a channel layer disposed on the substrate;
    a barrier layer disposed on the channel layer; and
    a passivation layer disposed between the gate electrode and the first field plate.

10. The high-electron mobility transistor of claim 9, wherein the source electrode constitutes an ohmic contact with the channel layer.

11. A method for fabricating a high-electron mobility transistor, comprising:
    providing a substrate;
    forming a gate electrode on the substrate;
    forming a drain electrode at one side of the gate electrode;
    forming a source electrode at another side of the gate electrode; and
    forming a first field plate, wherein the substrate comprises an active region, the first field plate is electrically connected with the source electrode and extends from the source electrode toward the drain electrode, an overlapping area of the first field plate and the gate electrode is smaller than an overlapping area of the gate electrode and the active region.

12. The method of claim 11, wherein a long side direction is defined by the gate electrode, the long side direction is parallel to a long side of the gate electrode, and the first field plate comprises:
   a first extending portion extending parallel to the long side direction;
   a second extending portion extending parallel to the long side direction; and
   at least one connecting portion connected between the first extending portion and the second extending portion.

13. The method of claim 12, wherein the at least one connecting portion is located in the active region.

14. The method of claim 13, wherein the first field plate comprises an H shape.

15. The method of claim 12, wherein the at least one connecting portion is located outside the active region.

16. The method of claim 15, wherein the first field plate comprises a U shape.

17. The method of claim 11, further comprising:
   forming a dielectric layer on the first field plate.

18. The method of claim 17, further comprising:
   forming a second field plate on the dielectric layer, wherein the second field plate is electrically connected with the source electrode and extends from the source electrode toward the drain electrode.

19. The method of claim 11, further comprising:
   forming a channel layer on the substrate;
   forming a barrier layer on the channel layer; and
   forming a passivation layer, wherein the passivation layer is disposed between the gate electrode and the first field plate.

20. The method of claim 19, wherein the source electrode constitutes an ohmic contact with the channel layer.

* * * * *